United States Patent [19]
Hogeboom

[11] Patent Number: 6,087,874
[45] Date of Patent: Jul. 11, 2000

[54] VARIABLE DELAY CIRCUIT FOR DELAYING LOGIC SIGNALS, CHARACTERIZED BY A DELAY TIME THAT IS A LINEAR FUNCTION OF A CONTROL VOLTAGE

[75] Inventor: John Gordon Hogeboom, Nepean, Canada

[73] Assignee: Nortel Networks Corporation, Montreal, Canada

[21] Appl. No.: 08/997,452

[22] Filed: Dec. 23, 1997

[51] Int. Cl.[7] ................................. H03H 11/26
[52] U.S. Cl. ................................. 327/270; 327/277
[58] Field of Search ................... 327/270, 266, 327/274, 280, 278, 285, 287, 288, 262, 271, 277, 284

[56] References Cited

U.S. PATENT DOCUMENTS

| | | | |
|---|---|---|---|
| 5,231,319 | 7/1993 | Crafts | 327/277 |
| 5,635,880 | 6/1997 | Brown | 331/108 |
| 5,734,284 | 3/1998 | Popescu | 327/283 |
| 5,793,238 | 8/1998 | Baker | 327/262 |
| 5,920,221 | 7/1999 | Shen et al. | 327/264 |

*Primary Examiner*—Toan Tran
*Assistant Examiner*—Quan Tra

[57] ABSTRACT

A delay circuit for delaying high-speed logic signals has a continuously-variable delay which is a linear function of a control current. The resulting delay time may be set as short as a single logic gate delay. The CMOS delay circuit comprises delay means having as its output an internal signal characterized by an internal signal swing, coupled to amplifier means whose output is the delayed logic signal, characterized by a settling time. The amplifier means contributes minimal delay. The swing of the internal signal of the delay circuit is controlled by differential negative feedback to be just sufficient to drive the next stage, while the delay circuit's settling time is controlled by capacitively coupled positive feedback to be as short as the delay itself. The differential negative feedback is provided by four MOS devices.

27 Claims, 1 Drawing Sheet

VARIABLE DELAY CIRCUIT FOR DELAYING LOGIC SIGNALS, CHARACTERIZED BY A DELAY TIME THAT IS A LINEAR FUNCTION OF A CONTROL VOLTAGE

FIELD OF THE INVENTION

This invention relates generally to logic circuits, and more particularly to logic delay circuits having continuously variable delay for use in high-speed data transmission.

BACKGROUND OF THE INVENTION

For oscillators which may be part of phase-locked loops (PLLs) or delay-locked loops (DLLs) and for logic signal delays which may be needed for matching and alignment, continuously variable directly are often required. Such delays are most useful if they have a delay value which is directly proportional to a control input voltage or current, if they have a wide delay range (extending down to a minimum delay time equivalent to the delay of one logic gate), and if they have rapid settling so that short pulse experience little width distortion. High-speed data communication systems have a need for such improved variable delay circuits, especially for use in making clock timing and in synchronizing data carried by high-speed data buses.

DESCRIPTION OF THE RELATED ART

In high-speed data communications, in which the duration of data bits is of the same order or smaller than uncertainties in their propagation time, it is necessary to generate a clock that is synchronized to the data link order to accurately regenerate the bit stream at the receiving end of each data link. When serial data paths are involved, a separate clock path running parallel to the data path is usually considered to be excessive in overhead. It is more common to increase the data rate of the serial data path by 12% to 25%, for example, so that the original bit stream can be encoded to provide an increased and guaranteed-minimum number of transitions to which a dock can be reliably phase locked. The phase-locked loop (PLL) needed for such dock generation is complicated by the need to handle a randomly variable number of missing transitions while remaining immune to locking at fractional ratios of the bit frequency. For parallel data signal paths, which are employed to further increase data rate, a parallel clock path usually represents the least overhead because this arrangement simplifies clock signal regeneration and the clock information is shared by all of the parallel data signals. A phase-locked loop or delay-locked loop can be used for regenerating such clock signals as well. Thus, for both serial and parallel data transmission, there is often a need for a continuously variable delay circuit having characteristics suitable for use with a PLL or DLL.

PROBLEMS SOLVED BY THE INVENTION

Many delay circuits available in the prior art have a nonlinear dependence of delay time upon their control inputs, which limits the applications of those circuits or at least limits them to narrow ranges of delay within which they have more or less linear response. To implement effective delay-locked loops (DLLs) and phase-locked loops (PLLs), it is necessary to have delay elements whose delay can be smoothly varied by the analog control voltage of the DLL or PLL and which cover a relatively wide delay range down to values similar to those of a single gate. It is also commonly desirable to have additional matching delay elements controlled in parallel to the delay elements of a DLL or PLL so that they provide well defined delays matched to the period of the DLL or PLL clock. This latter application puts anther requirement on the delay elements: that of rapid settling after a transition has passed. This rapid settling is needed in order that a closely following transition will be affected to a minimum degree by the close spacing of the two edges, one of several effects often named "inter-symbol interference." Furthermore, it is commonly required to generate ratioed delays. This need adds a requirement of having a delay dependency on the control voltage or current which is a linear function with minimal offset from the origin, i.e., a delay dependency that is proportional to the control voltage or current. This requirement is a practical requirement arising because any non-linearities and offsets that may occur are seldom accurately predictable. Hence, a summary of key delay element requirements for the intended applications is as follows:

1) Delay proportional to control input (voltage or current)
2) Wide delay variation down to a value near the intrinsic delay of one gate
3) Rapid settling for minimum inter-symbol interference.

Common methods of implementing variable delay elements fall short on one or more of the above key requirements. For example, some delay elements consist of one or more conventional CMOS inverters. Varying the supply voltage to a CMOS inverter to control its delay results in significant non-linearity and offset. There are also complications in controlling the voltages due to the load characteristics and due to the need to maintain centering about the switching point of an output level converter which would be required. In another common example, additional MOS devices in series with the switching devices of a CMOS inverter can control delay while maintaining full logic swings, but the capacitance on the current-limited nodes between the regulating devices and the switching devices causes significant non-linearity and offset, and the minimum practical delay is typically several times that of a standard inverter stage or even greater for low inter-symbol interference. These shortcomings of the background art may be avoided by use of the present invention.

PURPOSE, OBJECTS, AND ADVANTAGES OF THE INVENTION

The purpose of the invention is a variable delay circuit specially adapted for use with a phase-locked loop or delay-locked loop for synchronizing high-speed data and its associated clocks. Overall objects of the invention include reducing costs and risks in development of high-speed data buses, and improving the synchronization of clock signals used in data transmission. A specific object of the invention is producing a variable delay, with a wide range of delay times extending down to as little as that of one logic gate, with a linear characteristic of delay time vs. control current, and with settling time as short as the delay. Related objects of the invention include providing a delay element capable of operating with a wide range of input signal voltages, and providing a delay element with low power dissipation. A more particular object is providing such a delay element in CMOS technology. Other related objects include using a unique differential negative feedback circuit configuration to reduce and control the internal signal swing, and using capacitively coupled positive feedback to reduce settling time. Thus a particular object is providing a delay circuit including first delay means controlled by differential negative feedback, coupled to second delay means characterized by capacitively coupled positive feedback to reduce settling time.

SUMMARY OF THE INVENTION

A clock is always needed with transmitted data in order to define the position of individual bits in the date sequences, and if the data is directly transmitted without encoding, such a clock may require special handling.

A delay circuit for delaying high-speed logic signals has a continuously-variable delay which is a linear function of a control current. The resulting delay time may be set as short as a single logic gate delay. The delay circuit comprises first delay means having as its output an internal signal characterized by an internal signal swing, coupled to second delay means whose output is the delayed logic signal, characterized by a settling time. The swing of the internal signal of the delay circuit is controlled by differential negative feedback to be just sufficient to drive the next stage, while the delay circuit's settling time is controlled by capacitively coupled positive feedback to be as short as the delay itself. The differential negative feedback is provided by four MOS devices.

DETAILED DESCRIPTION OF THE PREFERRED EMBODIMENT

Figure 1:
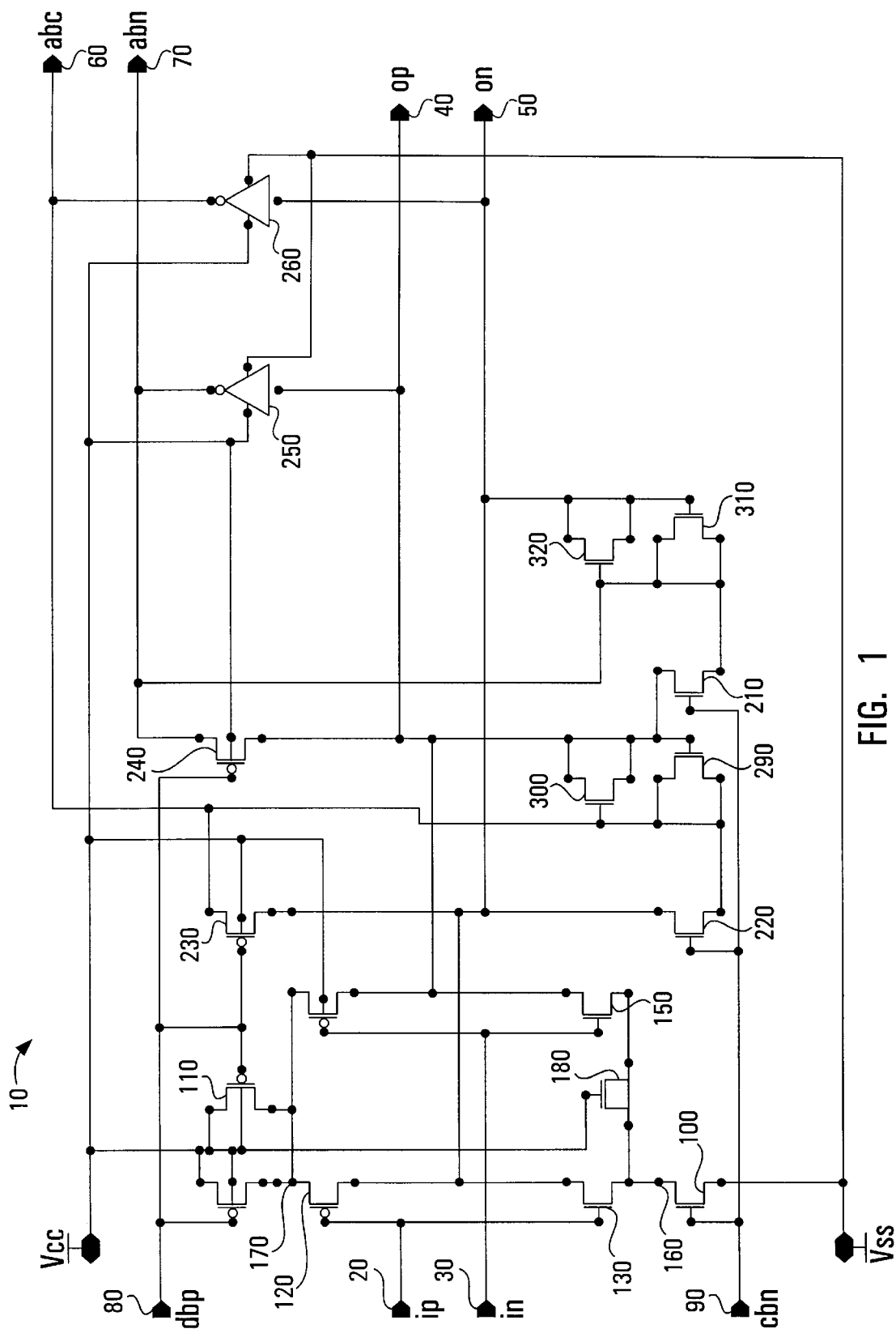
FIG. 1 shows a schematic diagram of a variable delay circuit made in accordance with the invention.

A CMOS variable delay circuit 10 made in accordance with the invention is shown in FIG. 1. Generally, this circuit employs a differential CMOS circuit structure with negative feedback to control signal swings and with positive capacitive feedback to achieve rapid settling. The differential structure along with the reduced swings largely eliminates non-linearity and offsets which would otherwise occur due to capacitance on the current-limiting nodes, thus providing good proportionality. Series MOS devices, biased by the same voltages used for the current-limiting devices, maintain signal swing at a value near to one-half of the supply voltage over a wide range of delays in a simple manner, which has nearly optimum effect on performance. The regulated moderate signal swing allows simple level conversion as well as decreased minimum delay. As a result, the minimum delay can approach a value below that of a single simple gate. An inverter pair used for feedback also serves as the output level converter. If there is a need for tapping off signals from a delay chain, this inverter pair isolates loading effects of those signals from affecting the delay chain performance. The differential structure of the circuit provides several performance advantages, including identical performance for rising and falling edges and matched inverted and non-inverted signal outputs. The differential structure also allows the same feedback points to be used for both positive and negative feedback by simple reversal. To make the performance of the end delay elements of a chain close to that of the middle elements and to each other, a simple differential attenuator is provided at the input to a delay chain, and some capacitive load is added on the last stage output.

In the circuit diagram FIG. 1, the delay element is denoted generally by reference numeral 10. Nodes 20 and 30 are the input nodes. Nodes 40 and 50 are the output nodes (connected to the next delay stage when used in a chain). Nodes 60 and 70 are feedback nodes (as well as being full-swing outputs, to be used for tapping off delayed signals). Nodes 80 and 90 are control nodes for input of complementary delay-control voltages. Devices 100 and 110 act as current-limiting devices. Complementary delay-control voltages applied to nodes 80 an 90 act to bias the current-limiting devices 100 and 110, which ultimately determine the delay. The delay element is formed by complementary differential pairs 120, 130, 140, and 150. Because n-channel devices are physically smaller than p-channel devices in silicon CMOS technologies, node 160 has less parasitic capacitance than node 170, therefore device 180 is added to adjust the two nodes to be more balanced in capacitance in order to make switching waveforms at nodes 40 and 50 more complementary. Devices 210, 220, 230, and 240 are the negative-feedback amplitude-limiting devices. When output nodes 60 and 70 reach voltage values close to full supply rail voltage values, the appropriate one of these devices 210, 220, 230, and 240 will begin to conduct. Thus devices 210, 220, 230, and 240 (via inverters 250 and 260) will limit the swing on output nodes 40 and 50 to be no greater than the value needed to maintain this output condition. Each inverter 250 and 260 is a conventional type of CMOS inverter formed by the series connection of the controlled current paths of an n-channel transistor and of a p-channel transistor. Inverters 250 and 260 function as amplifiers, with negative feedback occurring between their respective outputs and their respective inputs. Inverters 250 and 260 do not introduce significant delay. They restore the limited internal swing to near full level CMOS logic levels, and they isolate external loads. Because of the common bias on the gates of devices 210, 220, 230, and 240 and of the primary current-limiting devices 100 and 110, the output voltage swings at nodes 40 and 50 are maintained at minimum values and at relatively constant values over a wide range of delay conditions. Devices 290, 300, 310, and 320 act as the positive feedback capacitors, which quickly 'kick' nodes 40 ad 50 close to their final stable voltages when outputs 60 and 70 switch states. Thus, these devices have the desirable effect of decreasing the rise and fall times at nodes 40 and 50. The configuration of the four negative-feedback MOS devices 210, 220, 230, and 240 is a very important aspect of the invention in providing decreased minimum delay and in providing for simple level conversion.

In use of the variable delay circuit 10, the signal to be delayed is provided to input nodes 20 and 30, and suitable complementary delay-control voltage is applied to nodes 80 and 90. The propagation speed, i.e. 1/delay (the inverse of the delay time), is proportional to the current limit set by devices 100 and 110. That current limit is controlled by the control voltages connected to the gates of these devices 100 and 110. The appropriately delayed signal with fast settling time is taken from output nodes 40 and 50.

INDUSTRIAL APPLICABILITY

The invention has many industrial applications. In high-speed data communications, a phase-locked loop or delay-locked loop circuit used to extract and extend the timing synchronization is improved by use of the variable delay circuit disclosed herein, which has improved linearity and settling time as well as extended delay range.

Other embodiments of the invention will be apparent to those skilled in the art from a consideration of this specification or from practice of the invention disclosed herein. For example, the variable delay circuit can be implemented using other types of logic technology, such as bipolar or field-effect devices of optical technologies for applications, instead of (or mixed with) CMOS technology. It is intended that the specification and examples be considered as exemplary only, with the true scope and spirit of the invention being defined by the following claims and their legal equivalents.

What is claimed is:

1. A variable delay circuit for delaying a logic signal by a delay time set with a control voltage, said variable delay circuit comprising:

a first input for receiving a logic signal to be delayed by the delay time;

a second input for receiving the control voltage; and a delay unit coupled to said first and second inputs for receiving the logic signal and the control voltage, said delay unit being operative to:
   a) process the logic signal and the control voltage for generating an internal delayed signal that is variable;
   b) control variations of the internal delayed signal by differential negative feedback;

an output coupled to said delay unit for releasing a logic signal delayed by the delay time, derived from the internal delayed signal, the delay time being characterized in that it is a linear function of the control voltage applied at said second input.

2. A variable delay circuit for delaying a logic signal by a delay time set with a control voltage, said variable delay circuit comprising:

a first input for receiving a logic signal to be delayed by the delay time;

a second input for receiving the control voltage; and a delay unit coupled to said first and second inputs for receiving the logic signal and the control voltage, said delay unit being operative to:
   a) process the logic signal and the control voltage for generating a logic signal delayed by the delay time, said logic signal delayed by the delay time being characterized by a settling time;
   b) control said settling time by capacitively coupled positive feedback;

an output coupled to said delay unit for releasing a logic signal delayed by the delay time, the delay time being characterized in that it is a linear function of the control voltage applied at said second input.

3. A variable delay circuit for delaying logic signals by a delay time set with a control voltage, said variable delay circuit comprising:

a first input for receiving a logic signal to be delayed by the delay time;

a second input for receiving the control voltage; and a first delay unit coupled to said first and second inputs for receiving the logic signal and the control voltage, said first delay unit being operative to:
   a) process the logic signal and the control voltage for generating an internal delayed signal that is variable;
   b) control variations of the internal delayed signal by differential negative feedback;

a second delay unit coupled to said first delay unit and driven by said internal delayed signal, said second delay unit being operative to:
   a) generate a logic signal delayed by the delay time, derived from said internal delayed signal, said logic signal delayed by the delay time being characterized by a settling time;
   b) control said settling time by capacitively coupled positive feedback;

an output coupled to said second delay unit for releasing a logic signal delayed by the delay time, the delay time being characterized in that it is a linear function of the control voltage applied at said second input.

4. A variable delay circuit for delaying logic signals by a delay time comprising:

a) first delay unit for generating an internal delayed signal that is variable, variations of the internal delayed signal being controlled by differential negative feedback; and
   b) second delay unit coupled to said first delay unit and driven by said internal delayed signal, said second delay unit having an output characterized by said delay time and by a settling time, said settling time being controlled by capacitively coupled positive feedback.

5. A variable delay circuit for delaying logic signals by a delay time set with a complementary pair of delay-control voltages, comprising:

a) four CMOS devices interconnected pairwise to form a delay element and operable as two complementary differential pairs, said differential pairs receiving said logic signals as inputs and having output nodes, each of said output nodes releasing an internal signal being characterized by said delay time and by a signal amplitude variation;
   b) two current-limiting CMOS devices having first gates and being operable to set said delay time proportionally to said delay-control voltages, said current-limiting CMOS devices being biased by said complementary pair of delay-control voltages being applied to said first gates;
   c) four amplitude-limiting MOS devices for controlling the amplitude variation of the internal signal, said amplitude-limiting devices having second gates and being biased by said complementary pair of delay-control voltages being applied to said second gates;
   d) two CMOS inverters responsive to amplitude variation of the internal signal, said CMOS inverters operating to control the amplitude variation of the internal signal by negative differential feedback applied from their respective outputs to their respective inputs; and
   e) four CMOS devices for limiting a settling time of the internal signal, said CMOS devices capacitively coupled to said output nodes for providing positive feedback.

6. A variable delay circuit as recited in claim 1, comprising:

a) four CMOS devices interconnected pairwise to form a delay element and operable as two complementary differential pairs, said differential pairs receiving said logic signals as inputs and having output nodes, the internal signal being established between said output nodes;
   b) two current-limiting CMOS device, each having a first gate and being operable to set said delay time proportionally to said control voltage, each of said current-limiting CMOS devices being biased by said control voltage being applied to said first gate;
   c) four amplitude-limiting MOS devices for limiting variations of the internal signal, each of said amplitude-limiting devices having a second gate and being biased by said control voltage being applied to said second gate; and
   d) two CMOS inverters responsive to the internal signal at said output nodes, said CMOS inverters operating to control variations of the internal signal by negative differential feedback applied from their respective outputs to their respective inputs.

7. A variable delay circuit chain having a total chain delay time, comprising a plurality of variable delay circuits connected in series with respect to signal flow, having at least a first variable delay circuit and a last variable delay circuit, each said variable delay circuit thereof comprising:

a) delay unit having a signal input, a control input, and an intermediate delayed signal that is variable; and b) amplifier responsive to said intermediate delayed signal, said amplifier manifesting negative feedback for controlling variations of the intermediate delayed signal.

8. A variable delay circuit chain, comprising:

a) a plurality of the variable delay circuits as recited in claim 1, connected in series with respect to signal flow, having at least a first delay circuit and a last delay circuit;

b) a differential attenuator proceeding said first delay circuit; and c) a capacitive load following said last delay circuit, said differential attenuator and capacitive load being selected to match the delays of said first and last delay circuits.

9. A variable delay circuit as recited in claim 2, wherein said settling time is reduced by capacitively coupled positive feedback.

10. A variable delay circuit as recited in claim 2, comprising:

a) first delay unit for generating an internal delayed signal that is variable, variations of the internal signal being controlled by differential negative feedback; and b) second delay unit coupled to said first delay unit, said second delay unit having an output characterized by said delay time and by said settling time.

11. A variable delay circuit as recited in claim 4, wherein said output of said second delay unit drives a succeeding stage having a minimum input amplitude, the variations of said internal delayed signal are controlled to match said output of said second delay unit to said minimum input amplitude of said succeeding stage.

12. A variable delay circuit as recited in claim 4, wherein said first delay unit includes first and second differential inputs and a delayed output, said first differential input receiving a logic signal to be delayed, and said second differential input receiving feedback from an MOS device, said MOS device having a gate, and said gate being biased by a voltage to control said delay time.

13. A variable delay circuit as recited in claim 4, wherein said second delay unit includes a CMOS device providing said capacitively coupled positive feedback, whereby said settling time is reduced.

14. A variable delay circuit as recited in claim 4, wherein said first and second delay units each comprises a CMOS circuit.

15. A variable delay circuit as recited in claim 4, wherein said first delay unit (a) comprises:

i) four CMOS devices interconnected pairwise to form a delay element and operable as two complementary differential pairs; and ii) two current-limiting CMOS devices having first gates and being operable to set said delay time proportionally to said delay-control voltages, said current-limiting CMOS devices being biased by said complementary pair of delay-control voltages being applied to said first gates.

16. A variable delay circuit as recited in claim 4, wherein said second delay unit (b) comprises:

i) four amplitude-limiting MOS devices for controlling variations of the internal signal, said amplitude-limiting devices having second gates and being biased by said complementary pair of delay-control voltages being applied to said second gates;

ii) two CMOS inverters responsive to the internal signal at said output nodes, said CMOS inverters operating to control variations of the internal signal by negative differential feedback applied from their respective outputs to their respective inputs; and iii) four CMOS devices for limiting a settling time of the internal signal, said CMOS devices capacitively coupled to said output nodes for providing positive feedback.

17. A variable delay circuit chain, comprising:

A) a plurality of the variable delay circuit as recited in claim 16, connected in series with respect to signal flow, having at least a first delay circuit and a last delay circuit;

B) a differential attenuator preceding said first delay circuit; and

C) a capacitive load following said last delay circuit, said differential attenuator and capacitive load being selected to match the delays of said first and last delay circuits.

18. A variable delay circuit as recited in claim 5, wherein said four CMOS devices interconnected pairwise (a) comprise two n-channel devices and two p-channel devices, said variable delay circuit further comprising an additional n-channel MOS device inserted between said two n-channel devices.

19. A variable delay circuit as recited in claim 5, said variable delay circuit being powered by a supply voltage, wherein variations of the internal signal are limited to substantially one-half of said supply voltage.

20. A variable delay circuit chain, comprising:

a) a plurality of the variable delay circuits as recited in claim 5, connected in series with respect to signal flow, having at least a first delay circuit and a last delay circuit;

b) a differential attenuator preceding said first delay circuit; and c) a capacitive load following said last delay circuit, said differential attenuator and capacitive load being selected to match the delays of said first and last delay circuits.

21. A variable delay circuit chain as recited in claim 7, further comprising:

c) a differential attenuator preceding said first delay circuit; and d) a capacitive load following said last delay circuit, said differential attenuator and capacitive load being selected to match the delays of said first and last delay circuits.

22. A variable delay circuit chain as recited in claim 7, wherein, in each of said plurality of variable delay circuits, said amplifier (b) has an output characterized by a settling time, said settling time being controlled by capacitively coupled positive feedback.

23. A variable delay circuit chain as recited in claim 7, wherein, in each of said plurality of variable delay circuits, variations of said intermediate delayed signal are limited by device-coupled negative feedback.

24. A variable delay circuit chain as recited in claim 7, wherein each of said delay units comprises a CMOS circuit and each of said amplifiers comprises a CMOS circuit.

25. A variable delay circuit chain as recited in claim 7, wherein said control voltage is applied to each of said plurality of variable delay circuits, whereby said total chain delay time is controlled to be a linear function of said control voltage.

26. A variable delay circuit chain as recited in claim 7, wherein each of said amplifiers (b) comprises a CMOS inverter and each of said delay units comprises i) four CMOS devices interconnected pairwise to form a delay element and operable as two complementary differential pairs; and ii) two current-limiting CMOS devices having first gates and being operable to set said delay time proportionally to said delay-control voltages, said current-limiting CMOS devices being biased by said complementary pair of delay-control voltages being applied to said first gates.

27. A variable delay circuit chain as recited in claim 8, having a total chain delay time, wherein said control voltage is applied to each of said plurality of variable delay circuits, whereby said total chain delay time is controlled to be a linear function of said control voltage.

* * * * *